United States Patent
Sasaki (10) Patent No.: US 11,776,604 B2
(45) Date of Patent: Oct. 3, 2023

(54) MAGNETIC RECORDING ARRAY AND MAGNETORESISTANCE EFFECT UNIT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 335 days.

(21) Appl. No.: 17/420,474

(22) PCT Filed: Mar. 5, 2020

(86) PCT No.: PCT/JP2020/009380
§ 371 (c)(1),
(2) Date: Jul. 2, 2021

(87) PCT Pub. No.: WO2021/176646
PCT Pub. Date: Sep. 10, 2021

(65) Prior Publication Data
US 2022/0343959 A1    Oct. 27, 2022

(51) Int. Cl.
*G11C 11/00* (2006.01)
*G11C 11/16* (2006.01)
(Continued)

(52) U.S. Cl.
CPC ........... *G11C 11/161* (2013.01); *H10N 50/10* (2023.02); *H10N 50/85* (2023.02)

(58) Field of Classification Search
CPC ........ G11C 11/161; G11C 11/15; G11C 11/16
See application file for complete search history.

(56) References Cited

U.S. PATENT DOCUMENTS 6,862,215 B1    3/2005  Pancholy et al.
8,350,347 B2    1/2013  Gaudin et al.
(Continued)

FOREIGN PATENT DOCUMENTS

JP    2005-526351 A    9/2005
JP      5441005 B2     3/2014
(Continued)

OTHER PUBLICATIONS

Kato et al.; "Observation of the Spin Hall Effect in Semiconductors"; Science; vol. 306; 2004; pp. 1910-1913.
(Continued)

*Primary Examiner* — Pho M Luu
(74) *Attorney, Agent, or Firm* — Oliff PLC (57) ABSTRACT

A magnetic recording array includes a plurality of units. Each unit has a first magnetoresistance effect element, second magnetoresistance effect element, and writing transistor. Each of the first magnetoresistance effect element and the second magnetoresistance effect element has a wiring and a laminate which is laminated on the wiring. The writing transistor is connected to each of the wiring of the first magnetoresistance effect element and the wiring of the second magnetoresistance effect element. The wiring of the first magnetoresistance effect element and the wiring of the second magnetoresistance effect element are electrically connected in series at the time of writing, and a writing current flows through each of the wirings. A direction of a writing current flowing in the wiring of the first magnetoresistance effect element and a direction of a writing current flowing in the wiring of the second magnetoresistance effect element are opposite to each other.

11 Claims, 6 Drawing Sheets

(51) Int. Cl.
*H10N 50/10* (2023.01)
*H10N 50/85* (2023.01)

(56) References Cited

U.S. PATENT DOCUMENTS

| | | | |
|---|---|---|---|
| 10,483,457 | B1 | 11/2019 | Lee et al. |
| 10,483,459 | B2 | 11/2019 | Sugiyama et al. |
| 2006/0056223 | A1 | 3/2006 | Ditewig et al. |
| 2011/0129691 | A1 | 6/2011 | Ishiwata et al. |
| 2013/0028015 | A1* | 1/2013 | Matsui ............ G11C 11/161 365/173 |
| 2015/0348606 | A1 | 12/2015 | Buhrman et al. |
| 2016/0020207 | A1 | 1/2016 | Tsuchiya et al. |
| 2017/0222135 | A1 | 8/2017 | Fukami et al. |
| 2019/0051820 | A1 | 2/2019 | Sugiyama et al. |
| 2019/0189516 | A1 | 6/2019 | Sasaki et al. |
| 2022/0052111 | A1* | 2/2022 | Saito ............... G11C 11/161 |
| 2022/0406995 | A1* | 12/2022 | Shiokawa ........... H01L 27/105 |

FOREIGN PATENT DOCUMENTS

| | | |
|---|---|---|
| JP | 2016-021530 A | 2/2016 |
| JP | 2017-216286 A | 12/2017 |
| JP | 2019-033166 A | 2/2019 |
| JP | 6620915 B1 | 12/2019 |
| WO | 2016/021468 A1 | 2/2016 |
| WO | 2018/189964 A1 | 10/2018 |
| WO | 2019/171715 A1 | 9/2019 |

OTHER PUBLICATIONS

Miron et al.; "Perpendicular switching of a single ferromagnetic layer induced by in-plane current injection"; Nature; vol. 476; 2011; pp. 189-194.
Liu et al.; "Spin torque switching with the giant spin Hall effect of tantalum"; Science; vol. 336; 2012.
Liu et al.; "Current-Induced Switching of Perpendicularly Magnetized Magnetic Layers Using Spin Torque from the Spin Hall Effect"; Physical Review Letters; vol. 109; 2012; pp. 096602-1 to 096602-5.
Lee et al.; "Threshold current for switching of a perpendicular magnetic layer induced by spin Hall effect"; Applied Physics Letters; vol. 102; 2013; pp. 112410-1 to 112410-5.
Lee et al.; "Thermally activated switching of perpendicular magnet by spin-orbit spin torque"; Applied Physics Letters; vol. 104; 2014; pp. 072413-1 to 072413-5.
Fukami et al.; "Magnetization switching by spin-orbit torque in an antiferromagnet-ferromagnet bilayer system"; Nature Materials; vol. 15; 2016; pp. 535-541.
Fukami et al.; "A spin-orbit torque switching scheme with collinear magnetic easy axis and current configuration"; Nature Nanotechnology; vol. 11; 2016; pp. 1-5.
Takahashi et al.; "Spin injection and detection in magnetic nanostructures"; Physical Review B; vol. 67; 2003; pp. 052409-1 to 052409-4.
Seo et al.; "Area-Efficient SOT-MRAM With a Schottky Diode"; IEEE Electronic Device Letters; vol. 37; No. 8; 2016; pp. 982-985.
Zhang et al.; "Spin Hall Effects in Metallic Antiferromagnets"; Physical Review Letters; vol. 113; 2014; pp. 196602-1 to 196602-6.
Sato et al.; "Perpendicular-anisotropy CoFeB—MgO magnetic tunnel junctions with a MgO/CoFeB/Ta/CoFeB/MgO recording structure"; Applied Physics Letters; vol. 101; 2012; pp. 022414-1 to 022414-4.
Liu et al.; "Magnetic Oscillations Driven by the Spin Hall Effect in 3-Terminal Magnetic Tunnel Junction Devices"; Physical Review Letters; vol. 109; 2012; pp. 186602-1 to 186602-5.
Kimura et al.; "Electrical Control of the Direction of Spin Accumulation"; Physical Review Letters; vol. 99; 2007; 166601-1 to 166601-4.
Yu et al.; "Switching of perpendicular magnetization by spin-orbit torques in the absence of external magnetic fields"; Nature Nanotechnology; vol. 9; pp. 548-554; 2014.

* cited by examiner

MAGNETIC RECORDING ARRAY AND MAGNETORESISTANCE EFFECT UNIT

TECHNICAL FIELD

The present invention relates to a magnetic recording array and a magnetoresistance effect unit.

BACKGROUND ART

Attention has focused on next-generation nonvolatile memories to replace flash memories and the like of which miniaturization has reached its limit. For example, magnetoresistive random-access memories (MRAM), resistance random-access memories (ReRAM), phase change random-access memories (PCRAM), and the like are known as next-generation nonvolatile memories.

An MRAM is a memory element using a magnetoresistance effect element. A resistance value of a magnetoresistance effect element varies depending on a difference in relative angle between directions of magnetizations of two magnetic layers sandwiching a nonmagnetic layer therebetween. The MRAM records the resistance value of the magnetoresistance effect element as data.

For example, Patent Literature 1 discloses a spin-orbit torque magnetoresistance effect element utilizing spin-orbit torque (SOT) (for example, Patent Literature 1). In a spin-orbit torque magnetoresistance effect element, a current path at the time of writing and a current path at the time of reading differ from each other. Since a current at the time of writing with a high current density does not flow in a lamination direction of the magnetoresistance effect element, it is expected that the life of the element will be lengthened, or the like.

CITATION LIST

Patent Literature

[Patent Literature 1]
Specification of U.S. patent Ser. No. 10/483,459

SUMMARY OF INVENTION

Technical Problem

When data is read from an MRAM, a resistance value of a magnetoresistance effect element is read. The resistance value of a magnetoresistance effect element is derived in accordance with Ohm's law from a reading current applied in a lamination direction of the magnetoresistance effect element and an output voltage. An MRAM has a plurality of magnetoresistance effect elements. It takes time to obtain the resistance value of each of the plurality of magnetoresistance effect elements, and therefore a date reading speed is considered to be insufficient.

The present invention has been made in consideration of the foregoing problems and provides a magnetic recording array and a magnetoresistance effect unit capable of increasing a data-reading speed.

Solution to Problem (1) A magnetic recording array according to a first aspect includes a plurality of units. Each of the units has a first magnetoresistance effect element, a second magnetoresistance effect element, and a writing transistor. Each of the first magnetoresistance effect element and the second magnetoresistance effect element has a wiring and a laminate which is laminated on the wiring. The laminate has a first ferromagnetic layer, a nonmagnetic layer, and a second ferromagnetic layer in order from a side closer to the wiring. The writing transistor is connected to each of the wiring of the first magnetoresistance effect element and the wiring of the second magnetoresistance effect element. The wiring of the second magnetoresistance effect element are electrically connected in series at the time of writing, and a writing current flows through each of the wirings. A direction of a writing current flowing in the wiring of the first magnetoresistance effect element and a direction of a writing current flowing in the wiring of the second magnetoresistance effect element are opposite to each other.

(2) The magnetic recording array according to the foregoing aspect may further include a first reading wiring that is connected through the second ferromagnetic layers of the first magnetoresistance effect elements of a plurality of units arranged in a first direction, and a second reading wiring that is connected through the second ferromagnetic layers of the second magnetoresistance effect elements of the plurality of units arranged in the first direction.

(3) The magnetic recording array according to the foregoing aspect may further include a first wiring that is connected to the wirings of the first magnetoresistance effect elements in the plurality of units arranged in a second direction intersecting the first direction, and a second wiring that is connected to the wirings of the second magnetoresistance effect elements in the plurality of units arranged in the second direction intersecting the first direction.

(4) In the magnetic recording array according to the foregoing aspect, the first wirings and the second wirings may be at different heights.

(5) In the magnetic recording array according to the foregoing aspect, each of the units may further include a first transistor which is connected to the first wiring and the first magnetoresistance effect element, and a second transistor which is connected to the second wiring and the second magnetoresistance effect element.

(6) The magnetic recording array according to the foregoing aspect may further include a first gate wiring that is connected through the first transistors and the second transistors of a plurality of units arranged in the first direction among the plurality of units, and a second gate wiring that is connected through the writing transistors of the plurality of units arranged in the second direction.

(7) The magnetic recording array according to the foregoing aspect may further include a first wiring transistor that is connected to the first wiring, and a second wiring transistor that is connected to the second wiring.

(8) In the magnetic recording array according to the foregoing aspect, at least one of the plurality of units may be a first reference unit in which an electrical resistance of the wirings of the first magnetoresistance effect element and the second magnetoresistance effect element is higher than the electrical resistance of the wirings of the first magnetoresistance effect elements and the second magnetoresistance effect elements of other units. At least one of the plurality of units may be a second reference unit in which an electrical resistance of the wirings of the first magnetoresistance effect element and the second magnetoresistance effect element is lower than the electrical resistance of the wirings of the first magnetoresistance effect elements and the second magnetoresistance effect elements of other units.

(9) In the magnetic recording array according to the foregoing aspect, widths of the wirings of the first magnetoresistance effect element and the second magnetoresistance effect element of the first reference unit may be narrower than widths of the wirings of the first magnetoresistance effect elements and the second magnetoresistance effect elements of other units. Widths of the wirings of the first magnetoresistance effect element and the second magnetoresistance effect element of the second reference unit may be wider than widths of the wirings of the first magnetoresistance effect elements and the second magnetoresistance effect elements of other units.

(10) In the magnetic recording array according to the foregoing aspect, the wirings may be any of metals, alloys, intermetallic compounds, metal boride, metal carbide, metal silicide, and metal phosphide having a function of generating a spin current due to a spin Hall effect occurring when a current flows.

(11) A magnetoresistance effect unit according to a second aspect includes a first magnetoresistance effect element, a second magnetoresistance effect element, and a writing transistor. Each of the first magnetoresistance effect element and the second magnetoresistance effect element has a wiring and a laminate which is laminated on the wiring. The laminate has a first ferromagnetic layer, a nonmagnetic layer, and a second ferromagnetic layer in order from a side closer to the wiring. The writing transistor is connected to each of the wiring of the first magnetoresistance effect element and the wiring of the second magnetoresistance effect element. The wiring of the first magnetoresistance effect element and the wiring of the second magnetoresistance effect element are electrically connected in series at the time of writing, and a writing current flows through each of the wirings. A direction of a writing current flowing in the wiring of the first magnetoresistance effect element and a direction of a writing current flowing in the wiring of the second magnetoresistance effect element are opposite to each other.

Advantageous Effects of Invention

The magnetic recording array according to the foregoing aspects has a high data-reading speed.

DESCRIPTION OF EMBODIMENTS

Hereinafter, the present embodiment will be described in detail with reference to the diagrams suitably. In the drawings used in the following description, for the sake of convenience, characteristic portions may be illustrated in an enlarged manner in order to make the characteristics easy to understand, and dimensional proportions and the like of constituent elements may be different from those of the actual elements. Materials, dimensions, and the like exemplified in the following description are examples. The present invention is not limited thereto and can be suitably changed within a range in which the advantageous effects of the present invention are exhibited.

First, directions will be defined. A direction of a surface of a substrate Sub (refer to FIG. 3) which will be described below, is an x direction, and a direction orthogonal to the x direction is a y direction. For example, the x direction is a row direction in which units U are arrayed in a magnetic recording array which will be described below. For example, the y direction is a column direction in which the units U are arrayed in the magnetic recording array which will be described below. A z direction is a direction orthogonal to the x direction and the y direction. The z direction is an example of a lamination direction. Hereinafter, a positive z direction may be expressed as "upward", and a negative z direction may be expressed as "downward". The upward and downward directions do not necessarily coincide with a direction in which a gravitational force is applied.

First Embodiment

Figure 1:
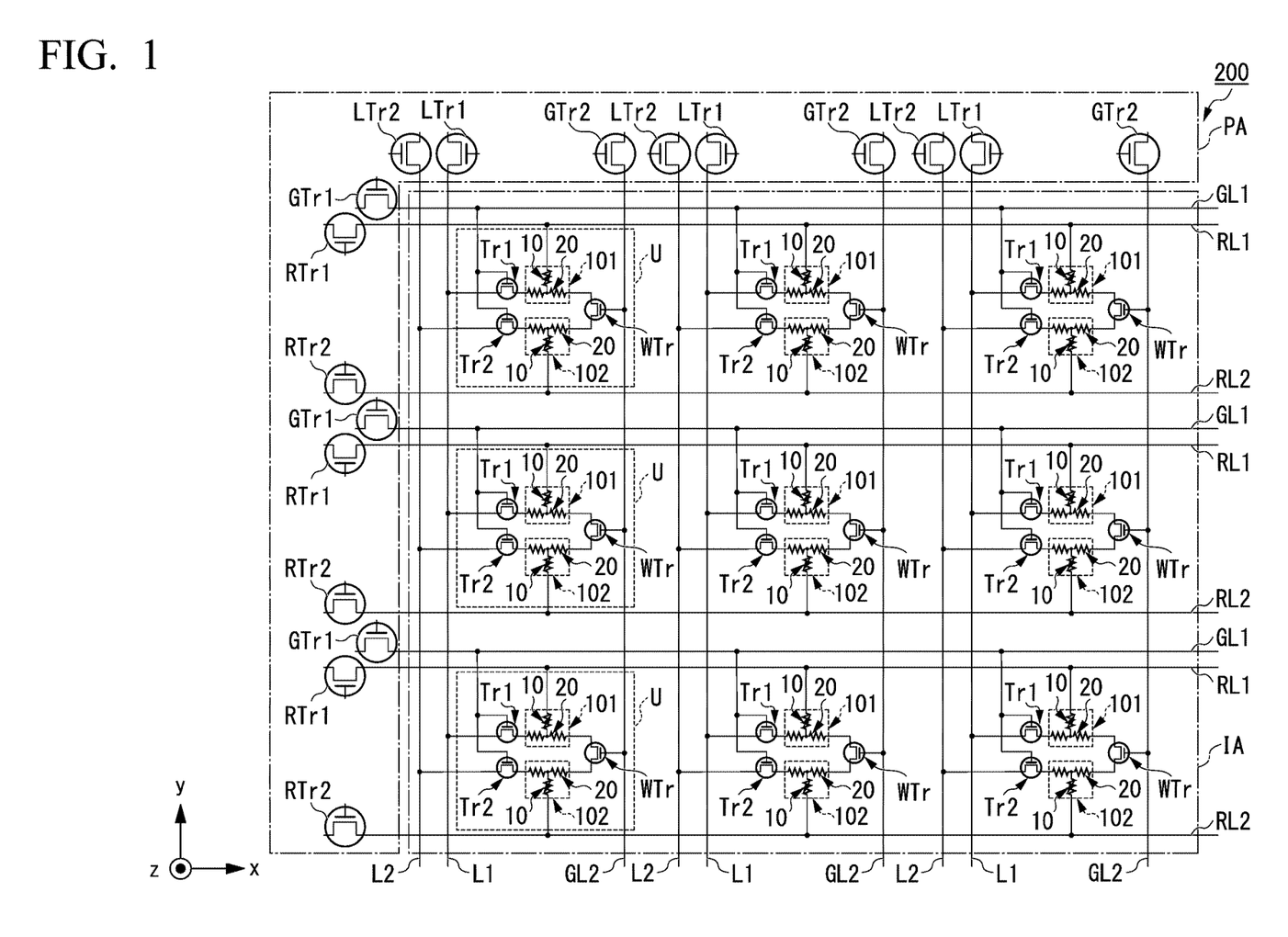
FIG. 1 is a circuit diagram of a magnetic recording array according to a first embodiment.

FIG. 1 is a circuit diagram of a magnetic recording array 200 according to a first embodiment. The magnetic recording array 200 has an integrated area IA and a peripheral area PA.

The integrated area IA is an area in which a plurality of units U are integrated. For example, each of the unit U is magnetoresistance effect unit including a magnetoresistance effect element. For example, the integrated area IA has a plurality of units U, a plurality of first wirings L1, a plurality of second wirings L2, a plurality of first reading wirings RL1, a plurality of second reading wirings RL2, a plurality of first gate wirings GL1, and a plurality of second gate wirings GL2. When integration within the integrated area IA is enhanced, a recording density of the magnetic recording array 200 increases.

For example, the plurality of units U are arrayed in a matrix. Each of the units U has a first magnetoresistance effect element 101, a second magnetoresistance effect element 102, a writing transistor WTr, a first transistor Tr1, and a second transistor Tr2. Details of the units U will be described below.

The first wiring L1 is connected to wirings 20 of the first magnetoresistance effect elements 101 via the first transistors Tr1. For example, the first wirings L1 individually extend in the y direction and are arranged in the x direction. For example, the first wiring L1 is connected to the respective wirings 20 of the first magnetoresistance effect elements 101 in the same column.

The second wiring L2 is connected to the wirings 20 of the second magnetoresistance effect elements 102 via the second transistors Tr2. For example, the second wirings L2 individually extend in the y direction and are arranged in the x direction. For example, the second wiring L2 is connected to the respective wirings 20 of the second magnetoresistance effect elements 102 in the same column.

The first reading wiring RL1 is connected to laminates 10 of the first magnetoresistance effect elements 101. Switching elements (for example, transistors) may be provided between the laminates 10 and the first reading wiring RL1. For example, the first reading wirings RL1 individually extend in the x direction and are arranged in the y direction. For example, the first reading wiring RL1 is connected through the respective laminates 10 of the first magnetoresistance effect elements 101 in the same row.

The second reading wirings RL2 is connected to the laminates 10 of the second magnetoresistance effect elements 102. Switching elements (for example, transistors) may be provided between the laminates 10 and the second reading wiring RL2. For example, the second reading wirings RL2 individually extend in the x direction and are arranged in the y direction. For example, the second reading wiring RL2 is connected through the respective laminates 10 of the second magnetoresistance effect elements 102 in the same row.

The first gate wiring GL1 is connected to respective gates of the first transistors Tr1 and the second transistors Tr2. For example, the first gate wirings GL1 individually extend in the x direction and are arranged in the y direction. For example, the first gate wiring GL1 is connected through the first transistors Tr1 and the second transistors Tr2 of the units U in the same row.

The second gate wiring GL2 is connected to respective gates of the writing transistors WTr. For example, the second gate wirings GL2 individually extend in the y direction and are arranged in the x direction. For example, the second wiring L2 is connected through the respective writing transistors WTr in the same column.

The peripheral area PA is an area in which a control element for controlling operation of the first magnetoresistance effect elements 101 and the second magnetoresistance effect elements 102 within the integrated area IA is mounted. For example, the peripheral area PA is provided on an outward side of the integrated area IA. For example, the peripheral area PA has a plurality of first wiring transistors LTr1, a plurality of second wiring transistors LTr2, a plurality of first gate transistors GTr1, a plurality of second gate transistors GTr2, a plurality of first reading transistors RTr1, and a plurality of second reading transistors RTr2.

The first wiring transistor LTr1 is connected to the first wiring L1 respectively. For example, the first wiring transistor LTr1 is connected to end part of the first wiring L1. The first wiring transistors LTr1 control currents flowing in the first wirings L1.

The second wiring transistors LTr2 is connected to the second wiring L2 respectively. For example, the second wiring transistor LTr2 is connected to end part of the second wiring L2. The second wiring transistors LTr2 control currents flowing in the second wirings L2.

The first reading transistor RTr1 is connected to the first reading wiring RL1 respectively. For example, the first reading transistor RTr1 is connected to end part of the first reading wiring RL1. The first reading transistors RTr1 control currents flowing in the first reading wirings RL1.

The first gate transistor GTr1 is connected to the first gate wiring GL1 respectively. The first gate transistors GTr1 is connected to end part of the first gate wiring GL1. The first gate transistors GTr1 control currents flowing in the first gate wirings GL1 and control on/off states of the first transistors Tr1 and the second transistors Tr2.

The second gate transistor GTr2 is connected to the second gate wiring GL2 respectively. The second gate transistor GTr2 is connected to end part of the second gate wiring GL2. The second gate transistors GTr2 control currents flowing in the second gate wirings GL2 and control on/off states of the writing transistors WTr.

The first wiring transistors LTr1, the second wiring transistors LTr2, the first gate transistors GTr1, the second gate transistors GTr2, the first reading transistors RTr1, and the second reading transistors RTr2 are field-effect transistors, for example. These may be substituted with other switch elements. For example, switch elements are elements which utilize a phase change in a crystal layer, such as an ovonic threshold switch (OTS), elements which utilize change in a band structure, such as a metal-insulator transition (MIT) switch, elements which utilize a breakdown voltage, such as a Zener diode and an avalanche diode, or elements in which conductivity changes in accordance with a change in atomic position.

Figure 2:
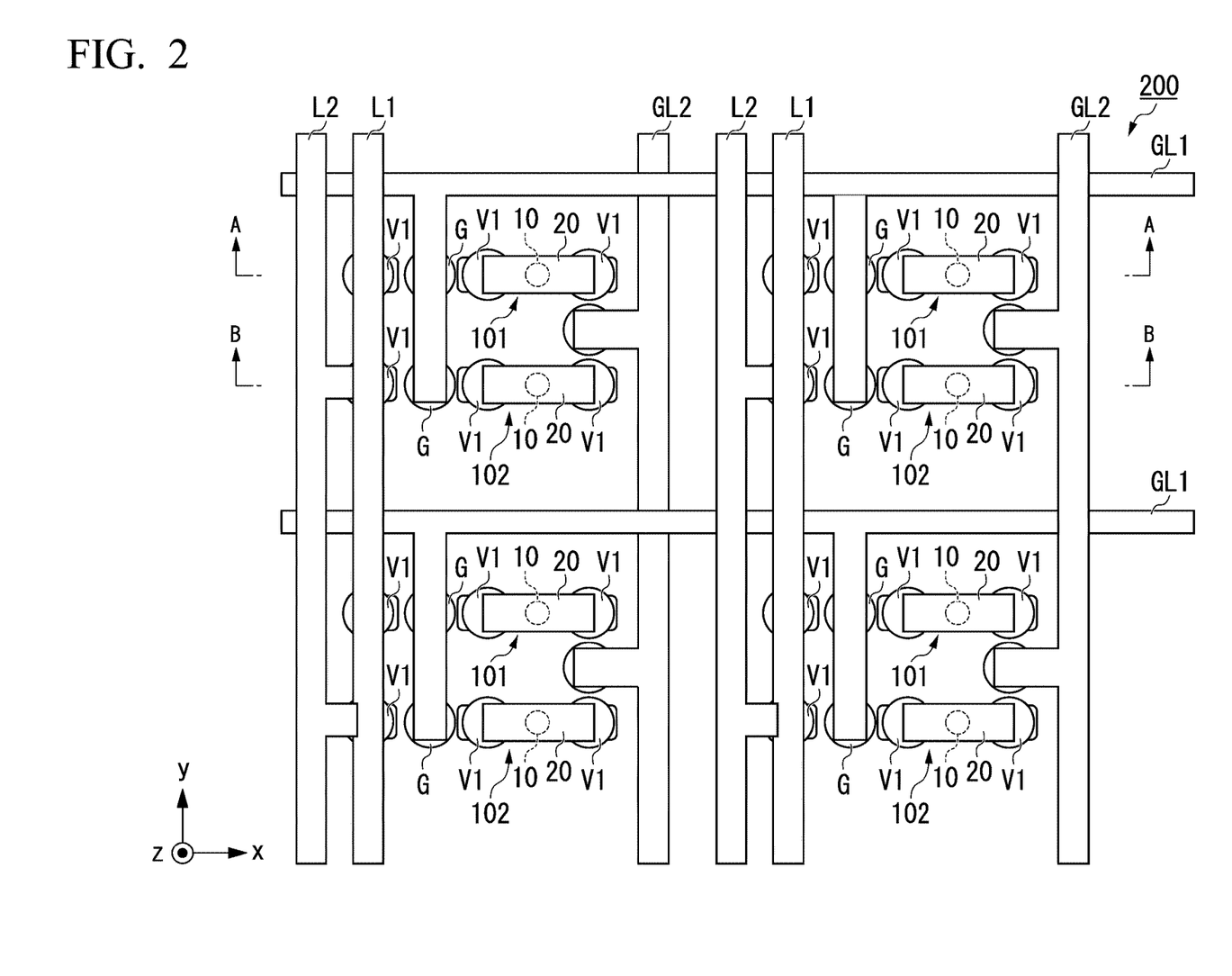
FIG. 2 is a plan view of the magnetic recording array according to the first embodiment.
Figure 3:
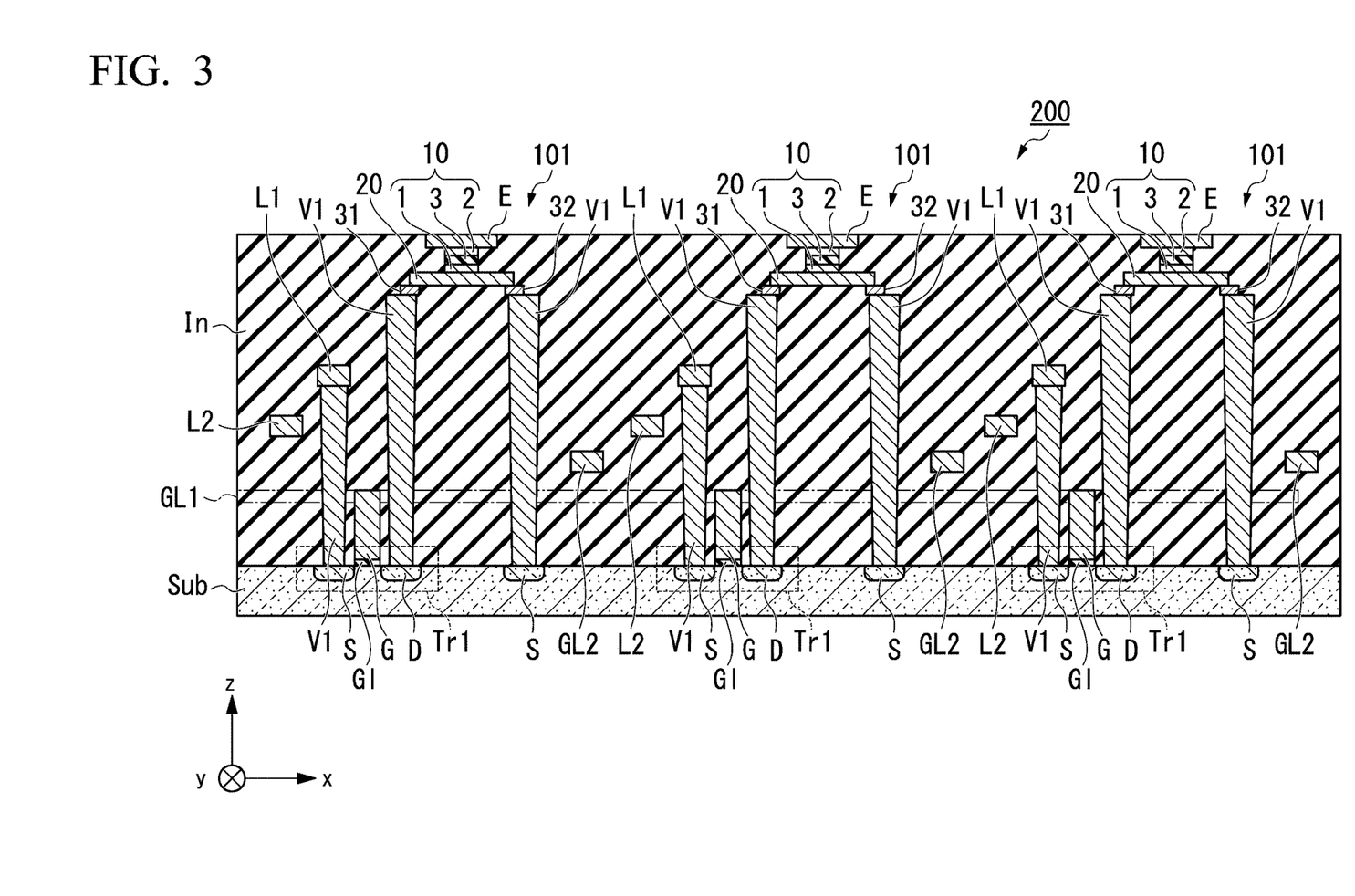
FIG. 3 is a cross-sectional view of the magnetic recording array according to the first embodiment.
Figure 4:
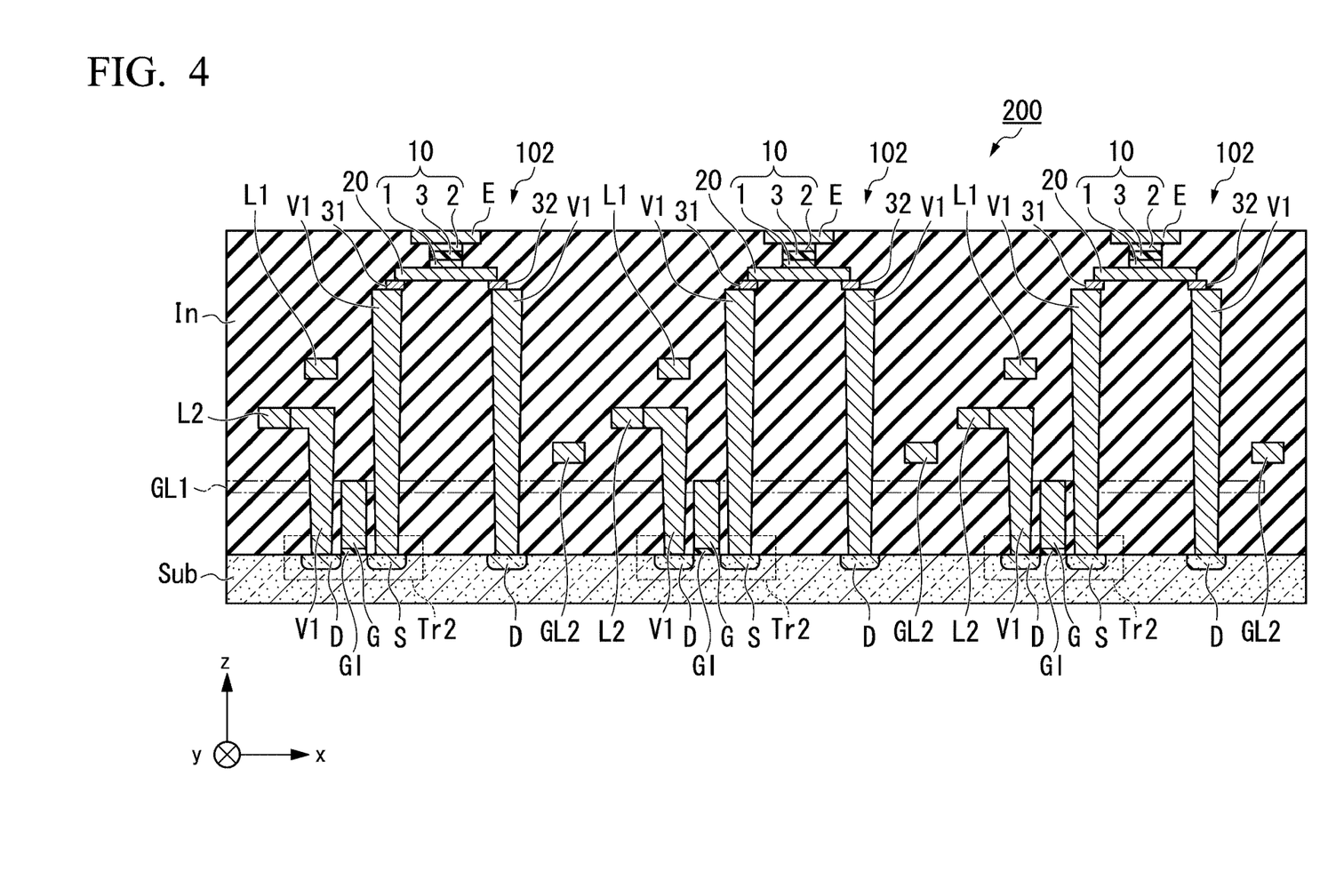
FIG. 4 is another cross-sectional view of the magnetic recording array according to the first embodiment.
Figure 5:
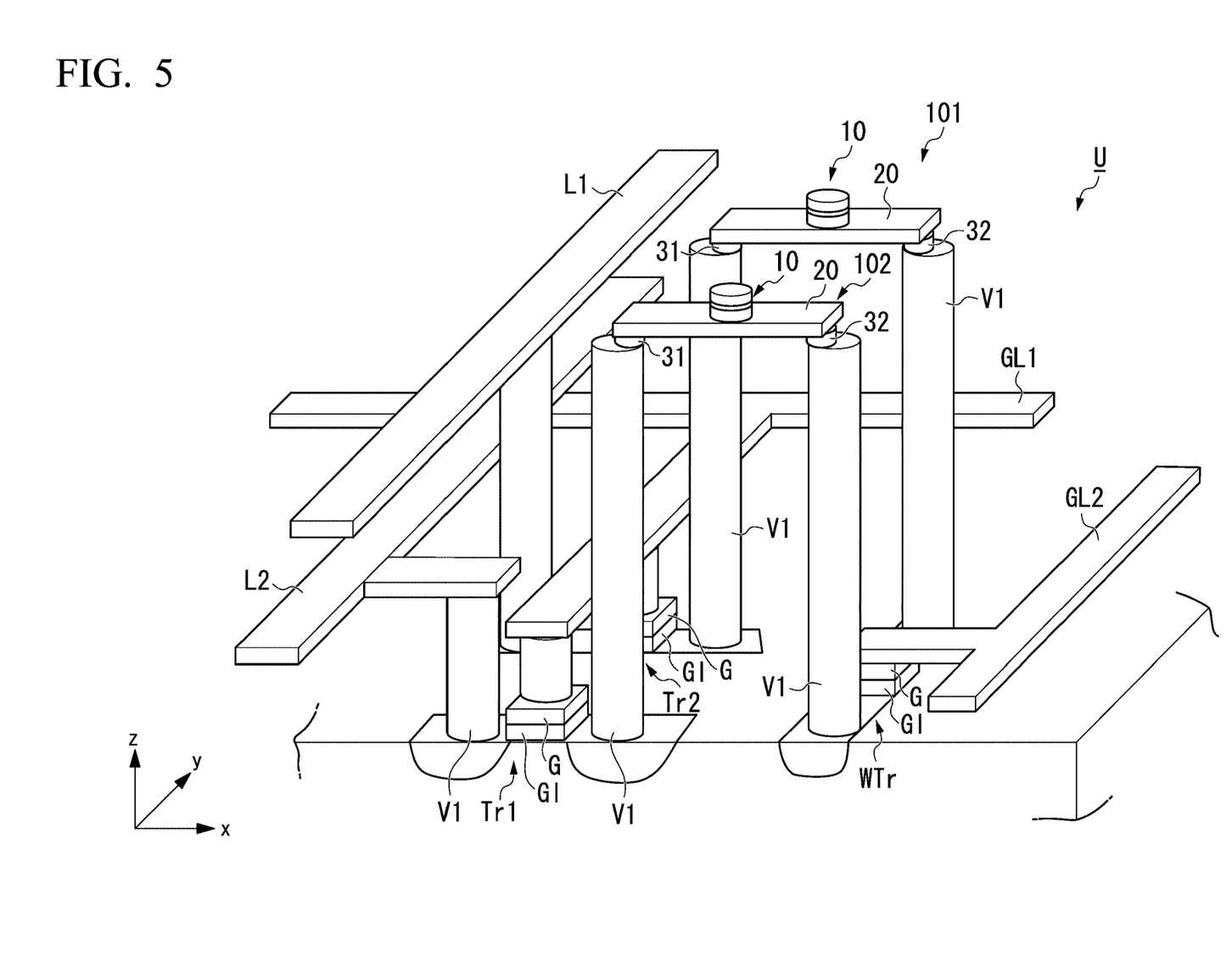
FIG. 5 is a perspective view of a magnetoresistance effect unit according to the first embodiment.

FIG. 2 is a plan view of the magnetic recording array 200 according to the first embodiment in the z direction. FIG. 2 selectively illustrates only conductive portions and excludes the first reading wirings RL1 and the second reading wirings RL2. FIGS. 3 and 4 are cross-sectional views of the magnetic recording array 200. FIG. 3 is a cross section cut along line A-A in FIG. 2. FIG. 4 is a cross section cut along line B-B in FIG. 2. In FIGS. 3 and 4, the first gate wirings GL1 at positions shifted in the y direction from the cut surface are indicated by a dotted line. In addition, FIG. 5 is a perspective view of one unit U of the magnetic recording array 200 according to the first embodiment.

Each of the units U has the first magnetoresistance effect element 101, the second magnetoresistance effect element 102, the writing transistor WTr, the first transistor Tr1, and the second transistor Tr2. The writing transistor WTr, the first transistor Tr1, and the second transistor Tr2 are formed on the substrate Sub. The first magnetoresistance effect element 101 and the second magnetoresistance effect element 102 are provided above the substrate Sub. These are connected to each other via a via wiring V1.

The first magnetoresistance effect element 101 and the second magnetoresistance effect element 102 are in a stage different from that of the writing transistor WTr, the first transistor Tr1, and the second transistor Tr2, for example. An insulating layer In is provided therebetween. The insulating layer In is an insulating layer for insulating wirings of multi-layer wirings or elements from each other. For example, the insulating layer In is made of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

For example, the writing transistor WTr, the first transistor Tr1, and the second transistor Tr2 are field-effect transistors. For example, each of the transistors has a source S, a drain D, a gate G, and a gate-insulating film Gl. The source S and the drain D are established in accordance with a flowing direction of a current and are the same area. In FIGS. 3 and 4, a case in which a writing current flows in the x direction of a wiring 21 of the first magnetoresistance effect element 101 and a negative x direction of a wiring 22 of the second magnetoresistance effect element 102 will be illustrated as an example.

The first transistor Tr1 is connected to the first wiring L1 and the first magnetoresistance effect element 101. The second transistor Tr2 is connected to the second wiring L2 and the second magnetoresistance effect element 102. The writing transistors WTr are connected to the first magnetoresistance effect element 101 and second magnetoresistance effect element 102, respectively. In addition, the gates G of the first transistor Tr1 and the second transistor Tr2 are connected to the first gate wiring GL1. The gate G of the writing transistor WTr is connected to the second gate wiring GL2.

Each of the first magnetoresistance effect elements 101 and the second magnetoresistance effect elements 102 has the laminate 10, the wiring 20, and conductive parts 31 and 32. The first magnetoresistance effect elements 101 and the second magnetoresistance effect elements 102 have a similar constitution. A resistance value of the laminate 10 in the z direction varies when spins are injected into the laminate 10 from the wiring 20. The first magnetoresistance effect elements 101 and the second magnetoresistance effect elements 102 are spin elements utilizing spin-orbit torque (SOT) and may be referred to as spin-orbit torque magnetoresistance effect elements, spin-injection magnetoresistance effect elements, or spin-current magnetoresistance effect elements. In addition, the wiring 20 may be referred to as a spin-orbit torque wiring.

The laminate 10 is laminated on the wiring 20. Another layer may be provided between the laminate 10 and the wiring 20. The laminate 10 is sandwiched between the wiring 20 and an electrode E in the z direction. The laminate 10 is a columnar body. For example, the shape of the laminate 10 in plan view in the z direction is a circular shape, an elliptical shape, or a quadrangular shape.

The laminate 10 has a first ferromagnetic layer 1, a second ferromagnetic layer 2, and a nonmagnetic layer 3. For example, the first ferromagnetic layer 1 comes into contact with the wiring 20 and is laminated on the wiring 20. Spins are injected into the first ferromagnetic layer 1 from the wiring 20. A magnetization of the first ferromagnetic layer 1 receives spin-orbit torque (SOT) due to injected spins, and an orientation direction thereof changes. The second ferromagnetic layer 2 is away from the first ferromagnetic layer 1 in the z direction. The first ferromagnetic layer 1 and the second ferromagnetic layer 2 sandwich the nonmagnetic layer 3 therebetween in the z direction.

Each of the first ferromagnetic layer 1 and the second ferromagnetic layer 2 has a magnetization. The orientation direction of the magnetization of the second ferromagnetic layer 2 is less likely to change than that of the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. The resistance value of the laminate 10 varies depending on a difference in relative angle between magnetizations of the first ferromagnetic layer 1 and the second ferromagnetic layer 2 sandwiching the nonmagnetic layer 3 therebetween.

The first ferromagnetic layer 1 and the second ferromagnetic layer 2 include a ferromagnetic substance. For example, a ferromagnetic substance is a metal selected from the group consisting of Cr, Mn, Co, Fe, and Ni, an alloy including one or more of these metals, an alloy including these metals and at least one or more elements of B, C, and N, or the like. For example, a ferromagnetic substance is a Co—Fe, Co—Fe—B, Ni—Fe, or Co—Ho alloy, a Sin-Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X represents a Co-, Fe-, Ni-, or Cu-group transition metal element or a precious metal element in the periodic table. Y represents a Mn-, V-, Cr-, or Ti-group transition metal or an element represented by X. Z is a typical element of Group III to Group V. For example, a Heusler alloy represents $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. A Heusler alloy has a high spin polarization.

The laminate 10 may have an antiferromagnetic layer on a surface of the second ferromagnetic layer 2 on a side opposite to a nonmagnetic layer 3 with a spacer layer therebetween. The second ferromagnetic layer 2, the spacer layer, and the antiferromagnetic layer constitute a synthetic antiferromagnetic structure (SAF structure). The synthetic antiferromagnetic structure is constituted of two magnetic layers with a nonmagnetic layer sandwiched therebetween. Due to antiferromagnetic coupling between the second ferromagnetic layer 2 and the antiferromagnetic layer, the second ferromagnetic layer 2 has a large coercivity compared to a case of having no antiferromagnetic layer. For example, the antiferromagnetic layer is made of IrMn, PtMn, or the like. For example, the spacer layer includes at least one selected from the group consisting of Ru, Ir, and Rh.

The laminate 10 may have another layer in addition to the first ferromagnetic layer 1, the second ferromagnetic layer 2, and the nonmagnetic layer 3. For example, an underlayer may be provided between the wiring 20 and the laminate 10. The underlayer enhances crystallinity of each of the layers constituting the laminate 10.

For example, the wiring 20 comes into contact with one surface of the laminate 10. The wiring 20 is a writing wiring for writing data in the first magnetoresistance effect element 101 or the second magnetoresistance effect element 102. The wiring 20 extends in the x direction. At least a portion of the wiring 20 and the nonmagnetic layer 3 sandwich the first ferromagnetic layer 1 therebetween in the z direction.

The wiring 20 generates a spin current due to a spin Hall effect occurring when a current i flows and injects spins into the first ferromagnetic layer 1. For example, the wiring 20 applies enough spin-orbit torque (SOT) to reverse the magnetization of the first ferromagnetic layer 1. The spin Hall effect is a phenomenon in which a spin current is induced in a direction orthogonal to the flowing direction of a current on the basis of a spin-orbit interaction occurring when a current flows. A spin Hall effect and a normal Hall effect are the same in that a movement (traveling) direction of moving (traveling) charges (electrons) is bent. In a normal Hall effect, the moving direction of charged particles moving in a magnetic field is bent due to a Lorentz force. In contrast, in a spin Hall effect, the traveling direction of spins is bent only due to traveling electrons (only due to flowing currents) even if there is no magnetic field.

For example, when a current flows in the wiring 20, first spins oriented in one direction and second spins oriented in a direction opposite to that of the first spins are individually bent due to a spin Hall effect in a direction orthogonal to the direction in which the current I flows. For example, the first spins oriented in a negative y direction are bent in the positive z direction, and the second spins oriented in a positive y direction are bent in the negative z direction.

In a nonmagnetic substance (a material that is not a ferromagnetic substance), the number of electrons in the first spins generated due to a spin Hall effect and the number of electrons in the second spins generated due to a spin Hall effect are equivalent to each other. That is, the number of electrons in the first spins in the positive z direction and the number of electrons in the second spins in the negative z direction are equivalent to each other. The first spins and the second spins flow in directions in which uneven distribution of spins is eliminated. In traveling of the first spins and the second spins in the z direction, since flows of charges cancel each other, the current amount becomes zero. A spin current without a current is particularly referred to as a pure spin current.

When a flow of electrons in the first spins is expressed as $J_\uparrow$, a flow of electrons in the second spins is expressed as $J_\downarrow$, and a spin current is expressed as $J_S$, they are defined as $J_S=J_\uparrow-J_\downarrow$. The spin current $J_S$ is generated in the z direction. The first spins are injected into the first ferromagnetic layer 1 from the wiring 20.

The wiring 20 includes any of a metal, an alloy, an intermetallic compound, metal boride, metal carbide, metal silicide, and metal phosphide having a function of generating a spin current due to a spin Hall effect occurring when the current I flows.

For example, the wiring 20 includes a nonmagnetic heavy metal as a main element. The main element indicates an element having the highest proportion among elements constituting the wiring 20. For example, the wiring 20 includes a heavy metal having a specific weight equal to or greater than that of yttrium (Y). Since a nonmagnetic heavy metal has a high atomic number (atomic number 39 or higher) and has d electrons or f electrons in an outermost shell, a strong spin-orbit interaction occurs. A spin Hall effect occurs due to a spin-orbit interaction, spins are likely to be unevenly distributed inside the wiring 20, and the spin current $J_S$ is likely to be generated. For example, the wiring 20 includes any one selected from the group consisting of Au, Hf, Mo, Pt, W, and Ta.

The wiring 20 may include a magnetic metal. A magnetic metal is a ferromagnetic metal or an antiferromagnetic metal. A slight amount of a magnetic metal included in a nonmagnetic substance becomes a scattering factor of spins. For example, a slight amount indicates an amount equal to or less than 3% of the total mole ratio of the elements constituting the wiring 20. When spins scatter due to a magnetic metal, a spin-orbit interaction is enhanced, and thus generation efficiency of a spin current with respect to a current increases.

The wiring 20 may include a topological insulator. A topological insulator is a substance of which the interior is an insulator or a high-resistance body and is a substance in which a spin-polarized metal state has occurred on a surface thereof. In a topological insulator, an internal magnetic field is generated due to a spin-orbit interaction. In a topological insulator, a new topological phase develops due to the effect of a spin-orbit interaction even if there is no external magnetic field. A topological insulator can generate a pure spin current with high efficiency due to a strong spin-orbit interaction and breaking of inversion symmetry at an edge.

For example, a topological insulator is made of SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. A topological insulator can generate a spin current with high efficiency.

The conductive part 31 and the conductive part 32 sandwich the laminate 10 therebetween in the x direction in plan view in the z direction. For example, the conductive parts 31 and 32 are connected to the via wiring V1, respectively. The conductive parts 31 and 32 are constituted of a material having excellent conductivity. For example, the conductive parts 31 and 32 include any one selected from the group consisting of Ag, Cu, Co, Al, and Au.

Subsequently, an example of a method of manufacturing the integrated area IA of the magnetic recording array 200 will be described. The integrated area IA is formed through a lamination step for each of the layers, and a processing step of processing a portion of each of the layers into a predetermined shape. A sputtering method, a chemical vapor deposition (CVD) method, an electron beam deposition method (EB deposition method), an atom laser deposition method, or the like can be used for laminating each of the layers. Each of the layers can be processed using photolithography or the like.

First, the first transistor Tr1, the second transistor Tr2, and the writing transistor WTr are prepared at predetermined positions on the substrate Sub. The transistors can be prepared by a known method.

Subsequently, the first gate wiring GL1 and the second gate wiring GL2 leading to the gates G of the first transistor Tr1, the second transistor Tr2, and the writing transistor WTr are prepared. The first gate wiring GL1 and the second gate wiring GL2 can be obtained by processing conductive layers into a predetermined shape through photolithography after the conductive layers are subjected to film formation. For example, the first gate wiring GL1 and the second gate wiring GL2 are prepared at different height positions. The height positions are adjusted to the height of the via wiring V1 leading to the gates G. The via wiring V1 is formed by forming an opening in the insulating layer and filling the inside of the opening with a conductor.

Subsequently, the first wiring L1 and the second wiring L2 are prepared. The first wiring L1 and the second wiring L2 can be obtained by processing conductive layers into a predetermined shape through photolithography after the conductive layers are subjected to film formation. For example, the first wiring L1 and the second wiring L2 are prepared at different height positions. The height positions are adjusted to the height of the via wiring V1 leading to the sources S or the drains D of the first transistor Tr1 and the second transistor Tr2.

Subsequently, the first magnetoresistance effect element 101 and the second magnetoresistance effect element 102 are prepared. First, openings are formed at positions overlapping the drain of the first transistor Tr1 of the insulating layer, the source and the drain of the writing transistor WTr, and the source of the second transistor Tr2 in the z direction. The via wiring V1 can be obtained by filling the openings with a conductor.

Subsequently, after an insulating layer covering the via wiring V1 is laminated, an opening is formed at a position overlapping the via wiring V1, and the conductive parts 31 and 32 are formed by filling the inside of the opening with a conductor. For example, a material harder than that of the via wiring V1 is used for the conductive parts 31 and 32. Surfaces of the insulating layer and the conductive parts 31 and 32 are subjected to chemical-mechanical polishing (CMP). Flatness of the surfaces is enhanced by using a hard material for the conductive parts 31 and 32.

Subsequently, a wiring layer, a ferromagnetic layer, a nonmagnetic layer, and a ferromagnetic layer are sequentially laminated on the surfaces of the insulating layer and the conductive parts 31 and 32. Subsequently, the wiring layer is processed into a predetermined shape. The wiring layer becomes the wiring 20 by being processed into a predetermined shape. Subsequently, the laminate 10 is formed by processing a laminate formed on the wiring layer into a predetermined shape, and thus the first magnetoresistance effect element 101 and the second magnetoresistance effect element 102 can be obtained. Last, the integrated area IA of the magnetic recording array 200 can be obtained by forming the first reading wirings RL1 connected through the laminates 10 of the first magnetoresistance effect elements 101 arranged in the row direction and the second reading wirings RL2 connected through the laminates 10 of the second magnetoresistance effect elements 102 arranged in the row direction.

Subsequently, operation of the magnetic recording array 200 according to the first embodiment will be described. Operation of the magnetic recording array 200 includes operation of writing data in the unit U and operation of reading data from the unit U.

First, a writing operation will be described. The first gate transistor GTr1 and the second gate transistor GTr2 leading to the unit U (writing object) are turned on.

When the first gate transistor GTr1 is turned on, charges are accumulated at the gates G of the first transistor Tr1 and the second transistor Tr2 leading to the first gate wiring GL1. When charges are accumulated at the gates G, the first transistor Tr1 and the second transistor Tr2 are turned on.

When the second gate transistor GTr2 is turned on, charges are accumulated at the gate G of the writing transistor WTr leading to the second gate wiring GL2. When charges are accumulated at the gate G, the writing transistor WTr is turned on.

As a result, the first wiring L1, the first transistor Tr1, the first magnetoresistance effect element 101, the writing transistor WTr, the second magnetoresistance effect element 102, the second transistor Tr2, and the second wiring L2 are electrically connected to each other. The first wiring L1 and the second wiring L2 are electrically connected in series.

In this state, the first wiring transistor LTr1 and the second wiring transistor LTr2 are turned on, and a writing current is applied from the first wiring L1 toward the second wiring L2, for example. A writing current sequentially flows in the first wiring L1, the first transistor Tr1, the wiring 20 of the first magnetoresistance effect element 101, the writing transistor WTr, the wiring 20 of the second magnetoresistance effect element 102, the second transistor Tr2, and the second wiring L2. A writing current flows through the first wiring L1 and the second wiring L2.

In the wiring 20 of the first magnetoresistance effect element 101, a writing current flows in a positive x direction. In contrast, in the wiring 20 of the second magnetoresistance effect element 102, a writing current flows in the negative x direction. The direction of a writing current flowing in the wiring 20 of the first magnetoresistance effect element 101 and the direction of a writing current flowing in the wiring 20 of the second magnetoresistance effect element 102 are opposite to each other.

When a writing current flows in the wiring 20, a spin Hall effect occurs, and spins are injected into the first ferromagnetic layer 1. Spins which have been injected into the first ferromagnetic layer 1 apply spin-orbit torque (SOT) to the magnetization of the first ferromagnetic layer 1 and change the orientation direction of the magnetization of the first ferromagnetic layer 1. The direction of spins injected into the first ferromagnetic layer 1 varies depending on the direction in which a writing current flows. The direction of spins injected into the first ferromagnetic layer 1 of the first magnetoresistance effect element 101 and the direction of spins injected into the first ferromagnetic layer 1 of the second magnetoresistance effect element 102 are opposite to each other. As a result, the orientation direction of the magnetization of the first ferromagnetic layer 1 of the first magnetoresistance effect element 101 and the orientation direction of the magnetization of the first ferromagnetic layer 1 of the second magnetoresistance effect element 102 are opposite to each other.

For example, when the magnetization of the first ferromagnetic layer 1 and the magnetization of the second ferromagnetic layer 2 of the laminate 10 in the first magnetoresistance effect element 101 have a parallel relationship therebetween, the magnetization of the first ferromagnetic layer 1 and the magnetization of the second ferromagnetic layer 2 of the laminate 10 in the second magnetoresistance effect element 102 have an antiparallel relationship therebetween. Namely, when a writing current is applied, pieces of data opposite to each other are written in the first magnetoresistance effect element 101 and the second magnetoresistance effect element 102. Either the first magnetoresistance effect element 101 or the second magnetoresistance effect element 102 is in a high resistant state (the magnetization of the first ferromagnetic layer 1 and the magnetization of the second ferromagnetic layer 2 are antiparallel to each other), and the other is in a low resistant state (the magnetization of the first ferromagnetic layer 1 and the magnetization of the second ferromagnetic layer 2 are parallel to each other).

Subsequently, a reading operation will be described. The first gate transistor GTr1 leading to the unit U reading data is turned on, and the second gate transistor GTr2 is turned off.

When the first gate transistor GTr1 is turned on, charges are accumulated at the gates G of the first transistor Tr1 and the second transistor Tr2 leading to the first gate wiring GL1. When charges are accumulated at the gate G, the first transistor Tr1 and the second transistor Tr2 are turned on.

When the second gate transistor GTr2 is turned off, the writing transistor WTr is turned off. When the writing transistor WTr is turned off, the first magnetoresistance effect element 101 and the second magnetoresistance effect element 102 are electrically separated from each other.

Subsequently, when the first reading transistor RTr1 and the first wiring transistor LTr1 are turned on, a reading current sequentially flows in the first reading wiring RL1, the first magnetoresistance effect element 101, and the first wiring L1, for example. Similar, when the second reading transistor RTr2 and the second wiring transistor LTr2 are turned on, a reading current sequentially flows in the second reading wiring RL2, the second magnetoresistance effect element 102, and the second wiring L2, for example. Since the writing transistor WTr is turned off, a reading current flows in paths different from each other.

As described above, either the first magnetoresistance effect element 101 or the second magnetoresistance effect element 102 is in a high resistant state, and the other is in a low resistant state. For this reason, a voltage output from the first wiring L1 and a voltage output from the second wiring L2 are different from each other. For example, a case in which a voltage output from the first wiring L1 is higher than a voltage output from the second wiring L2 is stipulated as "1", and a case in which a voltage output from the first wiring L1 is lower than a voltage output from the second wiring L2 is stipulated as "0". Namely, data can be read from the unit U by comparing a voltage output from the first wiring L1 and a voltage output from the second wiring L2 to each other.

As described above, in the magnetic recording array 200 according to the present embodiment, since the first magnetoresistance effect element 101 and the second magnetoresistance effect element 102 are electrically separated from each other by the writing transistor WTr, a potential difference between voltages output from the first magnetoresistance effect element 101 and the second magnetoresistance effect element 102 can be compared to each other, and thus data can be read. Therefore, in the magnetic recording array 200 according to the present embodiment, there is no need to convert a voltage into a resistance, and thus a high data-reading speed is achieved.

In addition, one unit U controls two magnetoresistance effect elements using three transistors, and excellent integration is achieved.

So far, the first embodiment has been described as an example, but the present invention is not limited to this example.

Second Embodiment

Figure 6:
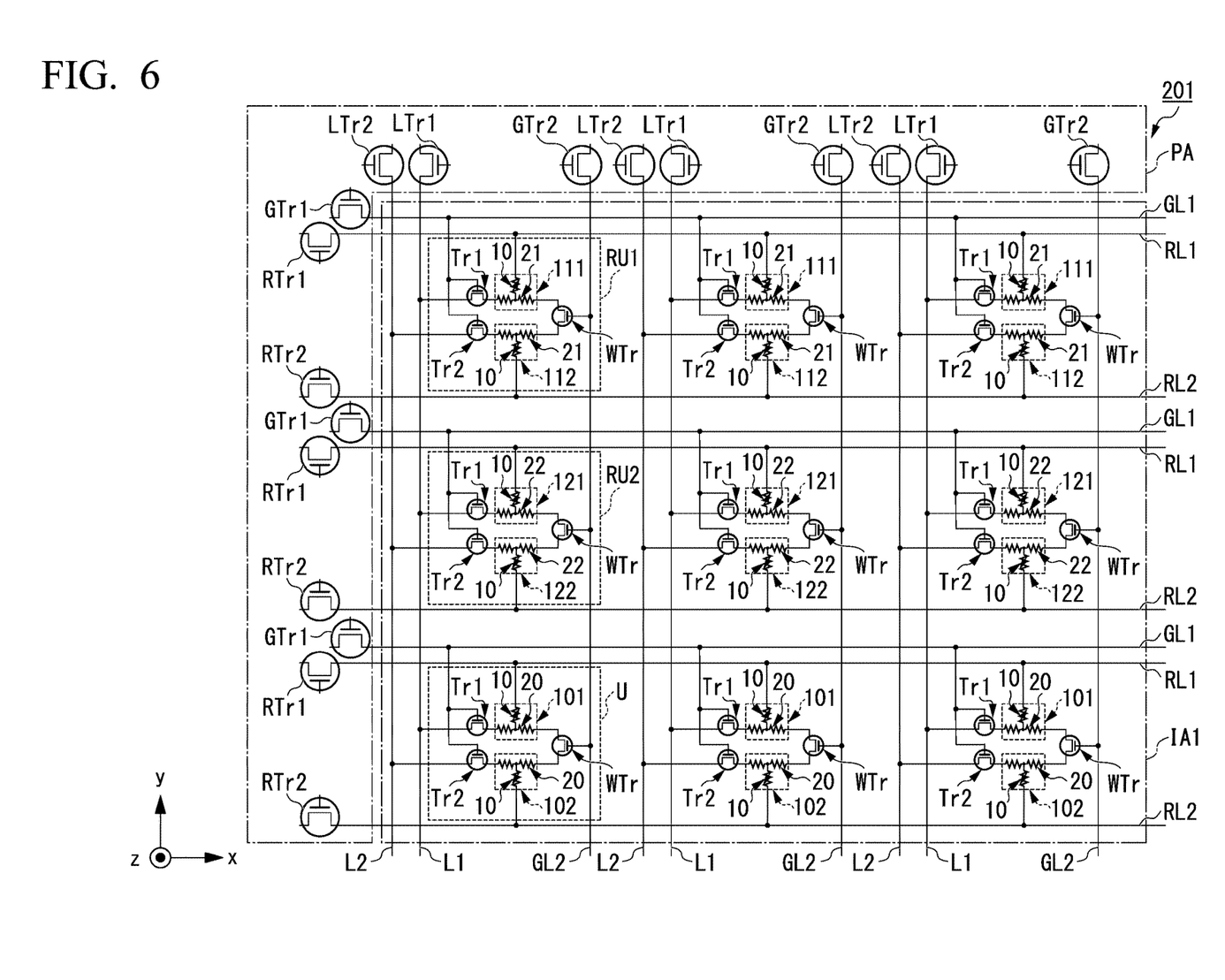
FIG. 6 is a circuit diagram of a magnetic recording array according to a second embodiment.

FIG. 6 is a circuit diagram of a magnetic recording array 201 according to a second embodiment. The magnetic recording array 201 according to the second embodiment differs from the magnetic recording array 200 according to the first embodiment in that some of the units U within an integrated area IA1 serve as first reference units RU1 and second reference units RU2. In the second embodiment, description of constitutions similar to those of the first embodiment will be omitted.

For example, one first reference unit RU1 and one second reference unit RU2 are provided in one column. For example, one first reference unit RU1 and one second reference unit RU2 are connected to one first wiring L1. The numbers of first reference units RU1 and second reference units RU2 are not limited to this case. At least one first reference unit RU1 and one second reference unit RU2 are provided within the magnetic recording array 201.

The first reference unit RU1 has a first magnetoresistance effect element 111 and a second magnetoresistance effect element 112. The first magnetoresistance effect element 111 and the second magnetoresistance effect element 112 have the laminate 10 and the wiring 21. The wiring 21 is the same as the wiring 20 except that it has a higher electrical resistance than the wiring 20. For example, the electrical resistance of the wiring 21 is equal to or greater than 105% of the electrical resistance of the wiring 20 and may be equal to or greater than 110% thereof.

A difference between the electrical resistances of the wiring 21 and the wiring 20 can be freely designed by changing the widths of the wirings, the thicknesses of the wirings, or a material constituting the wirings. For example, the width of the wiring 21 is narrower than the width of the wiring 20. For example, the width of the wiring 21 is equal to or smaller than 95% of the width of the wiring 20 and may be equal to or smaller than 90% thereof.

The second reference unit RU2 has a first magnetoresistance effect element 121 and a second magnetoresistance effect element 122. The first magnetoresistance effect element 121 and the second magnetoresistance effect element 122 have the laminate 10 and the wiring 22. The wiring 22 is the same as the wiring 20 except that it has a lower electrical resistance than the wiring 20. For example, the electrical resistance of the wiring 22 is equal to or lower than 95% of the electrical resistance of the wiring 20 and may be equal to or lower than 90% thereof.

A difference between the electrical resistances of the wiring 22 and the wiring 20 can be freely designed by changing the widths of the wirings, the thicknesses of the wirings, or a material constituting the wirings. For example, the width of the wiring 22 is wider than the width of the wiring 20. For example, the width of the wiring 22 is equal to or larger than 105% of the width of the wiring 20 and may be equal to or larger than 110% thereof.

The first reference unit RU1 and the second reference unit RU2 are used when checking whether writing is appropriately performed in the unit U.

For example, when a writing operation is performed in the unit U, a similar writing operation is also performed in the first reference unit RU1 and the second reference unit RU2 paired with the unit U. For example, the first reference unit RU1 and the second reference unit RU2 paired with the unit U are the first reference unit RU1 and the second reference unit RU2 connected to the same first wiring L1 as the unit U. A voltage applied to each of the wirings of the first reference unit RU1 and the second reference unit RU2 is the same as that to the unit U. The same load as that to the unit U is applied to the first reference unit RU1 and the second reference unit RU2, and the same data is written.

Subsequently, outputs of the unit U, the first reference unit RU1, and the second reference unit RU2 are compared to each other. When these operate appropriately, an output from the unit U is between those of the first reference unit RU1 and the second reference unit RU2.

When an output from the unit U is not between the first reference unit RU1 and the second reference unit RU2, it is possible to determine that a malfunction has occurred in the unit U.

Forms of a malfunction in the first magnetoresistance effect element 101 and the second magnetoresistance effect element 102 include deterioration and breakdown of the wiring 20 between the laminate 10 and the conductive parts 31 and 32. If the wiring 20 deteriorates or breaks down, an appropriate writing operation cannot be performed. For example, when the wiring 20 between the laminate 10 and the conductive part 31 deteriorates or breaks down, even though a writing operation cannot be performed, a reading operation can be performed. The reason for this is that a writing current flowing between the conductive part 31 and the conductive part 32 does not normally flow but a reading current between the laminate 10 and the conductive part 32 normally flows. In this case, data may be read without it being noticed that data has not been written, and thus a risk of erroneous reading of data increases. This malfunction mode can be appropriately detected by comparing an output of the unit U and outputs of the first reference unit RU1 and the second reference unit RU2 to each other.

In the magnetic recording array 201 according to the second embodiment, effects similar to those of the magnetic recording array 200 according to the first embodiment can be obtained.

In addition, in the magnetic recording array 201 according to the second embodiment, the presence or absence of a malfunction of the unit U can be evaluated in real time by comparing an output of the unit U and outputs of the first reference unit RU1 and the second reference unit RU2 to each other.

Moreover, since the first reference unit RU1 and the second reference unit RU2 are under the same temperature environment as that of the unit U, fluctuation of a reference point (a threshold for records of data) due to a temperature change can be curbed. Moreover, since the same load is applied to the first reference unit RU1 and the second reference unit RU2 as that to the unit U, fluctuation of a reference point (a threshold for records of data) due to deterioration can be curbed.

REFERENCE SIGNS LIST

1 First ferromagnetic layer
2 Second ferromagnetic layer
3 Nonmagnetic layer
10 Laminate
20, 21, 22 Wiring
101, 111, 121 First magnetoresistance effect element
102, 112, 122 Second magnetoresistance effect element
200, 201 Magnetic recording array
GL1 First gate wiring
GL2 Second gate wiring L1 First wiring
L2 Second wiring
LTr1 First wiring transistor
LTr2 Second wiring transistor
RL1 First reading wiring
RL2 Second reading wiring
RTr1 First reading transistor
RTr2 Second reading transistor
RU1 First reference unit
RU2 Second reference unit
Tr1 First transistor
Tr2 Second transistor
U Unit
WTr Writing transistor

What is claimed is:

1. A magnetic recording array, comprising:
a plurality of units,
wherein each of the units has a first magnetoresistance effect element, a second magnetoresistance effect element, and a writing transistor,
wherein each of the first magnetoresistance effect element and the second magnetoresistance effect element has a wiring and a laminate which is laminated on the wiring,
wherein the laminate has a first ferromagnetic layer, a nonmagnetic layer, and a second ferromagnetic layer in order from a side closer to the wiring,
wherein the writing transistor is connected to each of the wiring of the first magnetoresistance effect element and the wiring of the second magnetoresistance effect element,
wherein the wiring of the first magnetoresistance effect element and the wiring of the second magnetoresistance effect element are electrically connected in series at the time of writing,
wherein a writing current flows through each of the wirings, and
wherein a direction of the writing current flowing in the wiring of the first magnetoresistance effect element and a direction of the writing current flowing in the wiring of the second magnetoresistance effect element are opposite to each other.

2. The magnetic recording array according to claim 1 further comprising:
a first reading wiring that is connected through the second ferromagnetic layers of the first magnetoresistance effect elements of a plurality of units arranged in a first direction among the plurality of units; and
a second reading wiring that is connected through the second ferromagnetic layers of the second magnetoresistance effect elements of the plurality of units arranged in the first direction among the plurality of units.

3. The magnetic recording array according to claim 2 further comprising:
a first wiring that is connected to the wirings of the first magnetoresistance effect elements in a plurality of units arranged in a second direction intersecting the first direction among the plurality of units; and
a second wiring that is connected to the wirings of the second magnetoresistance effect elements in the plurality of units arranged in the second direction intersecting the first direction among the plurality of units.

4. The magnetic recording array according to claim 3, wherein the first wiring and the second wiring are at different heights.

5. The magnetic recording array according to claim 3,
wherein each of the units further includes a first transistor which is connected to the first wiring and the first magnetoresistance effect element, and a second transistor which is connected to the second wiring and the second magnetoresistance effect element.

6. The magnetic recording array according to claim 5, further comprising:
a first gate wiring that is connected through the first transistors and the second transistors of the plurality of units arranged in the first direction; and
a second gate wiring that is connected through the writing transistors of the plurality of units arranged in the second direction.

7. The magnetic recording array according to claim 3 further comprising:
a first wiring transistor that is connected to the first wiring; and
a second wiring transistor that is connected to the second wiring.

8. The magnetic recording array according to claim 1,
wherein at least one of the plurality of units is a first reference unit in which an electrical resistance of the wirings of the first magnetoresistance effect element and the second magnetoresistance effect element is higher than the electrical resistance of the wirings of the first magnetoresistance effect elements and the second magnetoresistance effect elements of other units, and
wherein at least one of the plurality of units is a second reference unit in which an electrical resistance of the wirings of the first magnetoresistance effect element and the second magnetoresistance effect element is lower than the electrical resistance of the wirings of the first magnetoresistance effect elements and the second magnetoresistance effect elements of other units.

9. The magnetic recording array according to claim 8,
wherein widths of the wirings of the first magnetoresistance effect element and the second magnetoresistance effect element of the first reference unit are narrower than widths of the wirings of the first magnetoresistance effect elements and the second magnetoresistance effect elements of other units, and
wherein widths of the wirings of the first magnetoresistance effect element and the second magnetoresistance effect element of the second reference unit are wider than widths of the wirings of the first magnetoresistance effect elements and the second magnetoresistance effect elements of other units.

10. The magnetic recording array according to claim 1,
wherein the wirings are any of metals, alloys, intermetallic compounds, metal boride, metal carbide, metal silicide, and metal phosphide having a function of generating a spin current due to a spin Hall effect occurring when a current flows.

11. A magnetoresistance effect unit, comprising:
a first magnetoresistance effect element, a second magnetoresistance effect element, and a writing transistor,
wherein each of the first magnetoresistance effect element and the second magnetoresistance effect element has a wiring and a laminate which is laminated on the wiring,
wherein the laminate has a first ferromagnetic layer, a nonmagnetic layer, and a second ferromagnetic layer in order from a side closer to the wiring, wherein the writing transistor is connected to each of the wiring of the first magnetoresistance effect element and the wiring of the second magnetoresistance effect element, wherein the wiring of the first magnetoresistance effect element and the wiring of the second magnetoresistance effect element are electrically connected in series at the time of writing, wherein a writing current flows through each of the wirings, and wherein a direction of a writing current flowing in the wiring of the first magnetoresistance effect element and a direction of a writing current flowing in the wiring of the second magnetoresistance effect element are opposite to each other.

* * * * *